(12) United States Patent
Pedersen

(10) Patent No.: US 10,578,470 B2
(45) Date of Patent: Mar. 3, 2020

(54) METHOD FOR EVALUATING A FREQUENCY SPECTRUM

(71) Applicant: GRUNDFOS HOLDING A/S, Bjerringbro (DK)

(72) Inventor: Ole Hartlev Pedersen, Bjerringbro (DK)

(73) Assignee: GRUNDFOS HOLDING A/S, Bjerringbro (DK)

( * ) Notice: Subject to any disclaimer, the term of this patent is extended or adjusted under 35 U.S.C. 154(b) by 11 days.

(21) Appl. No.: 15/783,409

(22) Filed: Oct. 13, 2017

(65) Prior Publication Data

US 2018/0106650 A1   Apr. 19, 2018

(30) Foreign Application Priority Data

Oct. 14, 2016   (EP) ..................................... 16193922

(51) Int. Cl.
    *G01F 1/66*    (2006.01)
    *G01F 15/06*    (2006.01)
    *G01F 1/32*    (2006.01)

(52) U.S. Cl.
    CPC ............... *G01F 1/663* (2013.01); *G01F 1/662* (2013.01); *G01F 1/667* (2013.01); *G01F 15/068* (2013.01);
(Continued)

(58) Field of Classification Search
CPC ...... G01F 1/3209; G01F 1/3245; G01F 1/329; G01F 1/663; G01F 1/662; G01F 2/667; G01F 15/068
See application file for complete search history.

(56) References Cited

U.S. PATENT DOCUMENTS

| 5,429,001 | A | * | 7/1995 | Kleven | .................. | G01F 1/329 |
| | | | | | | 327/552 |
| 5,503,035 | A | * | 4/1996 | Itoh | ....................... | G01F 1/3209 |
| | | | | | | 73/861.19 |

(Continued)

FOREIGN PATENT DOCUMENTS

| EP | 2 388 614 A2 | 11/2011 |
| JP | 3 675 443 B2 | 7/2005 |

(Continued)

*Primary Examiner* — David A Rogers
(74) *Attorney, Agent, or Firm* — McGlew and Tuttle, P.C.

(57) ABSTRACT

A method evaluates a frequency spectrum representative of at least one time-dependent signal, the at least one time dependent signal being derived from an output from a measuring device under predetermined measuring device operating conditions. The time-dependent signal, includes a portion being representative of a wanted signal, and a portion being representative of noise. The method includes the steps of determining, based on the frequency spectrum of the signal, a value representative of the noise floor, identifying, based on the frequency spectrum of the signal derived under the predetermined operating condition, a peak component, and if the peak component satisfies a relative peak criterion determined on the basis of the determined value representative of the noise floor, determining the wanted signal by applying a predetermined algorithm. The invention further relates to a method for determining flow of a vortex measuring device, and a vortex sensor.

20 Claims, 3 Drawing Sheets

(52) U.S. Cl.
CPC ............ *G01F 1/329* (2013.01); *G01F 1/3209* (2013.01); *G01F 1/3245* (2013.01)

(56) References Cited

U.S. PATENT DOCUMENTS

| | | | | | |
|---|---|---|---|---|---|
| 5,841,035 | A | * | 11/1998 | Andoh | ................. G01F 1/3281 73/861.22 |
| 6,212,975 | B1 | * | 4/2001 | Cook | ................... G01F 1/3254 702/190 |
| 6,351,999 | B1 | * | 3/2002 | Maul | ..................... G01F 1/3209 356/439 |
| 6,480,812 | B1 | * | 11/2002 | Wada | ....................... G01F 1/329 702/191 |
| 6,910,387 | B2 | * | 6/2005 | Koudal | ................ G01F 1/3209 73/861.22 |
| 7,398,165 | B1 | * | 7/2008 | Miau | ................. G01F 1/3209 702/45 |
| 7,487,057 | B2 | * | 2/2009 | Heilig | ................... G01D 3/022 702/106 |
| 7,946,185 | B2 | * | 5/2011 | Washio | ................... G01F 1/329 73/861.22 |
| 8,215,183 | B2 | | 7/2012 | Petroff | |
| 8,234,932 | B2 | * | 8/2012 | Tips | ...................... G01F 1/3218 73/861.24 |
| 2004/0216532 | A1 | * | 11/2004 | Koudal | ................ G01F 1/3209 73/861.22 |
| 2015/0122049 | A1 | * | 5/2015 | Berkcan | ................ G01K 1/00 73/861 |
| 2016/0123783 | A1 | * | 5/2016 | Strub | .................... G01F 1/3209 73/861.24 |
| 2016/0230540 | A1 | * | 8/2016 | Zhao | ...................... E21B 47/10 |
| 2017/0370751 | A1 | * | 12/2017 | Mann | .................... G01F 1/3209 |

FOREIGN PATENT DOCUMENTS

| | | | | |
|---|---|---|---|---|
| WO | 90/04230 | A1 | 4/1990 | |
| WO | WO-03005229 | A1 * | 1/2003 | ............ G06F 17/14 |
| WO | 2013/067338 | A2 | 5/2013 | |

* cited by examiner 1   2   4   8   16   No of Average 1   2   4   8   16   No of Average

| No-average   | 1 | 0 | 0 | 0 | 0 | 0 |
|--------------|---|---|---|---|---|---|
| Average-of-2 | X | 1 | 0 | 0 | 0 | 0 |
| Average-of-4 | X | X | 1 | 0 | 0 | 0 |
| Average-of-8 | X | X | X | 1 | 0 | 0 |
| Average-of-16| X | X | X | X | 1 | 0 |
| Detection    | Flow | | | | | Zero Flow |

| Channel       |   |   |   |   |   |   |   |   |
|---------------|---|---|---|---|---|---|---|---|
| No-Average    | 0 | X | X | X | X | 1 | 0 | 0 |
| Average-of-2  | 0 | 0 | 0 | 0 | 1 | 1 | 1 | 1 |
| Average-of-4  | 0 | 0 | 0 | 1 | 1 | X | 0 | 1 |
| Average-of-8  | 0 | 0 | 1 | 1 | 1 | 0 | 0 | 0 |
| Average-of-16 | 0 | 1 | 1 | 1 | 1 | 0 | 0 | 0 |
| Detection     | Zero Flow | Steady State Flow | | | | Dynamic Flow | | |

METHOD FOR EVALUATING A FREQUENCY SPECTRUM

CROSS REFERENCE TO RELATED APPLICATIONS

This application claims the benefit of priority under 35 U.S.C. § 119 of European Application 16 193 922.8, filed Oct. 14, 2016, the entire contents of which are incorporated herein by reference.

FIELD OF THE INVENTION

The invention relates to a method for evaluating a frequency spectrum, a method for determining flow of a vortex measuring device, and a vortex sensor for carrying out the method for evaluating a frequency spectrum.

BACKGROUND OF THE INVENTION

Measuring devices, as for example, vortex flow meters are known in prior art for measuring flow velocity of liquids or gases in pipelines. Further, there are known so-called multivariable vortex meters which offer a couple of advantages over regular vortex flow meters. Specifically, these multivariable vortex meters are temperature and pressure compensated, thereby offering more precise results and enabling direct measurement of mass flow in fluids flowing through a pipeline.

Basically, a multivariable vortex meter may be configured to measure flow, relative pressure and temperature, for example, by means of a 3-in-one sensor with a microelectromechanical system chip (MEMS). This sensor chip has two measuring components: 1. A Wheatstone bridge of four resistors with piezo-resistive effect at a pressure sensitive membrane. If a differential pressure is applied, the membrane will bend, and the four resistors in the Wheatstone bridge are subject to mechanical stress and will change resistance with two resistors decreasing resistance and two resistors increasing resistance. Under application of a DC voltage, the Wheatstone bridge will yield a pressure dependent voltage output. 2. A resistor with a Temperature Coefficient of Resistance (TCR) changing due to the temperature of the MEMS.

In order to measure flow, relative pressure and temperature of a fluid flowing through a pipeline by means of only one MEMS element, the sensor may only have one open port at the positive MEMS side, as used in relative pressure sensors. At the negative pressure side, atmospheric pressure is applied from the inside of the sensor housing.

However, for measuring flow by means of vortex meters, usually a two-port sensor is implemented being arranged downstream of the bluff body. The velocity of the vortices causes small pressure changes, and when passing the two-port sensor, the latter will measure a small differential pressure. While vortices will pass the sensor in an alternating manner with respect to the positive and negative pressure ports, the signal measured by the sensor will be a small sine signal comprising some noise from hydraulic or other noise sources. The number of the vortices generated per second is proportional to the flow so that the flow algorithm has to determine the frequency of the sine and multiply it with a factor to obtain a value for the flow in the desired unit.

The use of two-port sensors in vortex flow meters has the ad-vantage that a rather good sine signal comprising little noise is obtained from the sensor. With low flow, the sine amplitude will have very low amplitude, but the relative pressure (namely, pressure related to atmospheric pressure) in the vortex tube will comprise hydraulic noise as harmonic noise components and/or large and rapid pressure deviations. Thus, there is a disadvantage with respect to the configuration described above that the two-port pressure sensor is only sensitive to differential pressure but not to relative pressure, because the two-port solution effectively protects the sine signal from being altered by the hydraulic noise of the relative pressure.

Nevertheless, the above described two-port solution is able to measure both flow and temperature. In order to be able to additionally measure relative pressure by means of the above mentioned MEMS, the two-port sensor housing has to be replaced by a one-port sensor housing.

However, when using a one-port housing, the sensor will also be sensitive to hydraulic noise emanating from the hydraulic relative pressure noise. Thus, the resulting sine curve will be modified or distorted due to that noise. In fact, since the characteristics and magnitude of the hydraulic noise differ from application to application, and even will differ over time within the same application, this unpredictable noise poses a severe problem to measuring vortex flow with only one pressure port.

Also other measuring devices, as for example, thermal flow meters comprising a plurality of temperature sensors for measuring a thermal profile around a heated body have to deal with the problem of unpredictable noise. With respect to such applications, it is necessary to measure very small temperature differences. Noise, for example, from an electronic circuit, can be problematic as well as noise caused by the medium.

SUMMARY OF THE INVENTION

Therefore, the present invention is based on an object to provide a method for measuring, managing, and reducing noise during a measurements which are disturbed by relatively high noise. This object is solved according to the present invention by a method for evaluating a frequency spectrum representative of at least one time-dependent signal and a method for determining flow of a vortex measuring device, and a vortex sensor for carrying out the method.

Accordingly, a method for evaluating a frequency spectrum representative of at least one time-dependent signal is provided, the at least one time dependent signal being derived from an output from a measuring device under predetermined measuring device operating conditions, the measuring device comprising at least two sensors, the time dependent signal comprising a portion being representative of a wanted signal, and a portion being representative of noise, wherein the method comprises the steps of —determining, based on the frequency spectrum of the signal a representative of the noise floor, —identifying, based on the frequency spectrum of the signal derived under the predetermined operating condition, a peak component, and —if the peak component satisfies a relative peak criterion determined on the basis of the determined representative of the noise floor, determining the wanted signal by applying a predetermined algorithm.

By the inventive method, for the implementation of which a measuring device with more than one sensor is employed, measurements which are disturbed by relatively high noise and very small local differences smaller than the noise between the individual sensors can be carried out reliably. The inventive method enables measurements adaptive to the current noise which makes an auto noise reduction by an averaging procedure adapted to the current situation which only delivers a measurable difference, if there is a statistically significant difference. By the inventive method, it is possible to measure very small differences that normally cannot be measured when the signal is "buried" in or mixed by noise. The inventive method applies noise reduction that is only activated when there is a need for it, thus, the noise reduction is adaptive and fits the specific noise. In applications where the noise level changes from time to time, the inventive method can be used to secure that no ensuring is biased due to noise. When the noise is low, the resolution is high, and when the noise is high, the resolution is low. The inventive method ensures that the measurement is set to zero whenever there is no statistical significance that it does not have a value greater than zero.

Further, according to the present invention, a method is provided, wherein the measuring device is a vortex measuring device, and wherein the time-dependent signal comprises a portion being representative of a flow, and a portion being representative of noise. Thus, a reliable procedure for distinguishing between noise component and a vortex component in a spectrum, in particular, generated at low flow rates is provided rendering correct results for any application of a vortex sensor implemented for flow measurement in a pipe. In particular, the inventive method is very well suited to be used in connection with vortex meters comprising a one-port housing so as to be able to determine, even at low flow rates, relative pressure, temperature and flow with only one MEMS.

Alternatively, the measuring device may be a thermal flow meter comprising a plurality of temperature sensors for measuring a thermal profile around a heated body. Also, in this kind of application, it is necessary to measure the very small temperature differences and this embodiment enables measuring very low flow. In contrast to most flowmeter principles, the method according to this preferred embodiment is useful by employing an adaptive noise reduction.

According to a preferred embodiment of the method, a value for the noise floor is calculated as an average of a number of selected noise representative frequency spectrum components. Thereby, the accuracy of the results is increased substantially.

According to another preferred embodiment of the inventive method, the noise representative frequencies spectrum components are selected among frequency components below a predefined frequency value, wherein the noise representative frequencies spectrum components are the remaining components after selecting a predetermined number of high value frequency components, wherein the high value frequency components are a predetermined number of frequency components with the highest amplitude values. Preferably, those selected noise representative frequencies spectrum components below a predefined frequency value may be averaged to determine the noise floor.

Preferably, a relative peak signal is determined from the difference between the noise floor and the wanted signal, wherein the relative peak signal is larger than or equal to the relative peak criterion.

It is advantageous, if the predetermined algorithm is adaptive with respect to the noise by —always calculating the relative peak criterion as a function of the noise being present, and —selecting a suitable averaging procedure securing a stable wanted signal output, in particular selecting an averaging procedure with the least required number of averaging runs based on the current noise floor.

Thereby, an intelligent adaptive solution is provided being suitable and providing reliable results for any kind of application. In order to keep response time for the averaging procedure as low as possible, it is particularly advantageous to keep the number of averaging runs at a minimum required depending on the noise floor. The higher the noise floor is, the more averaging runs may be required to identify a signal in the noise with the desired confidence level. The lower the noise floor is, the fewer averaging runs may be required to identify a signal in the noise with the desired confidence level. Therefore, response time may be minimized by selecting a suitable averaging procedure depending on the current noise floor. The selected number of averaging runs may depend on the noise floor in such a manner that the number of averaging runs is the lowest integer sufficiently high to ensure that the there is a statistically significant difference between the noise and the wanted signal, i.e. a signal can be differentiated from the noise at a pre-determined confidence level. Furthermore, the relative peak criterion may be adapted to the noise floor and/or to the number of averaging runs and/or the number of selected noise representative frequencies spectrum components. On the one hand, the relative peak criterion can be released for a selected averaging procedure with a higher number of averaging runs at a higher noise floor, in particular at low flow, in order to be able to identify lower flow signals. On the other hand, the relative peak criterion can be stricter for a selected averaging procedure with a lower number of averaging runs at a lower noise floor, in particular at high flow, in order to reduce the risk of misidentifying noise peaks as high flow signals.

The frequency spectrum may be calculated by averaging frequency spectra of a predetermined number of time dependent signals derived from the output of the measuring device. This increases the accuracy of the results even further.

Further, a method for determining flow of a vortex measuring device is provided, comprising the step of computing a sequence of frequency spectra, each frequency spectrum of the sequence being computed by the method described above, wherein for the first spectrum of the sequence, the predetermined number is 1, and for each subsequent spectrum of the sequence, the predetermined number is increased by a predetermined positive integer value, and wherein for each frequency spectrum of the sequence of frequency spectra, the corresponding flow is determined by applying the predetermined algorithm, and evaluating if at least one flow is determined to be greater than the noise floor, then the first spectrum of the sequence of spectra where the determined flow is greater than the noise floor, is selected as basis for calculating the flow of the vortex measuring device, otherwise determining the flow to be zero flow.

Preferably, each frequency spectrum is divided into a number of discrete frequency components, and identifying the peak component comprises the step of deriving the peak by interpolating based on several frequency components.

According to a preferred embodiment, each frequency spectrum of the sequence of frequency spectra is numbered with a consecutively increasing channel number, the first frequency spectrum being numbered with the smallest channel number, the last frequency spectrum being numbered with the largest channel number, wherein frequency spectra having higher channel numbers being averaged over frequency spectra of predetermined numbers of time dependent signals with lower frequency limits than frequency spectra of predetermined numbers of time dependent signals, having lower channel numbers, wherein prior to the evaluating step, for each frequency spectrum of the sequence of frequency spectra, the corresponding flow is determined by applying the predetermined algorithm, and if the flow of the spectrum having the smallest channel number is determined to be greater than the noise floor, that spectrum is selected as basis for calculating a steady state flow of the vortex measuring device, otherwise if the flow of the spectrum having the smallest channel number is determined to be equal to the noise floor and at least one of the spectra having a channel number between the smallest and the largest channel number having a flow greater than the noise floor, one of the spectra having a flow greater than the noise floor is selected as a basis for calculating a dynamic flow of the vortex measuring device, otherwise performing the evaluating step.

The method may further comprise a step of determining a stationary flow and a dynamic flow.

Preferably, the output signal is a relative pressure signal.

Moreover, it is advantageous, if the vortex measuring device comprises a vortex sensor which is arranged within a one-port housing.

Further, according to the invention, a vortex sensor is provided being adapted to carry out the method according to the invention.

Further details and features of the invention as well as concrete embodiments of the invention may be derived from the following description in connection with the drawings. The various features of novelty which characterize the invention are pointed out with particularity in the claims annexed to and forming a part of this disclosure. For a better understanding of the invention, its operating advantages and specific objects attained by its uses, reference is made to the accompanying drawings and descriptive matter in which preferred embodiments of the invention are illustrated.

DESCRIPTION OF THE PREFERRED EMBODIMENTS

Figure 1A:
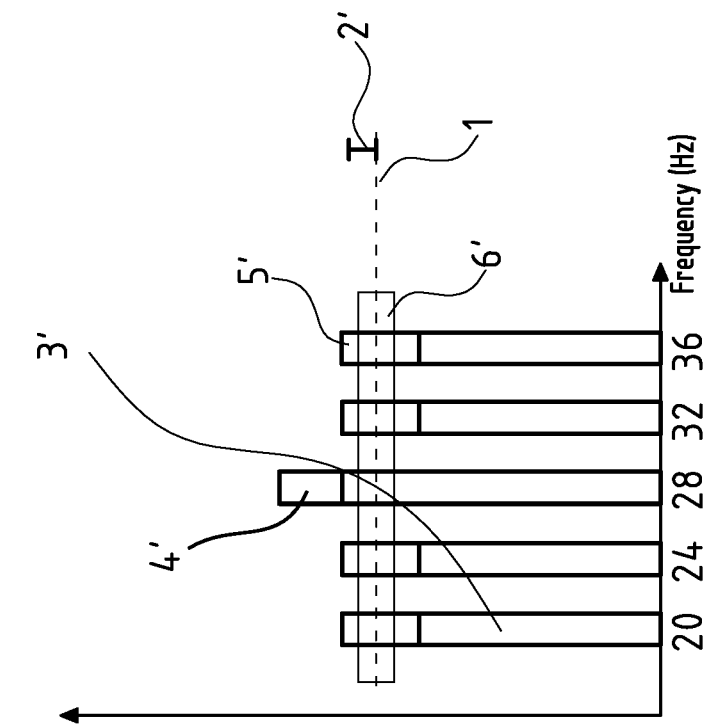
FIG. 1A, is a graph showing a spectrum comprising a vortex component at 28 Hz and showing a frequency spectrum being obtained after one run.
Figure 1B:
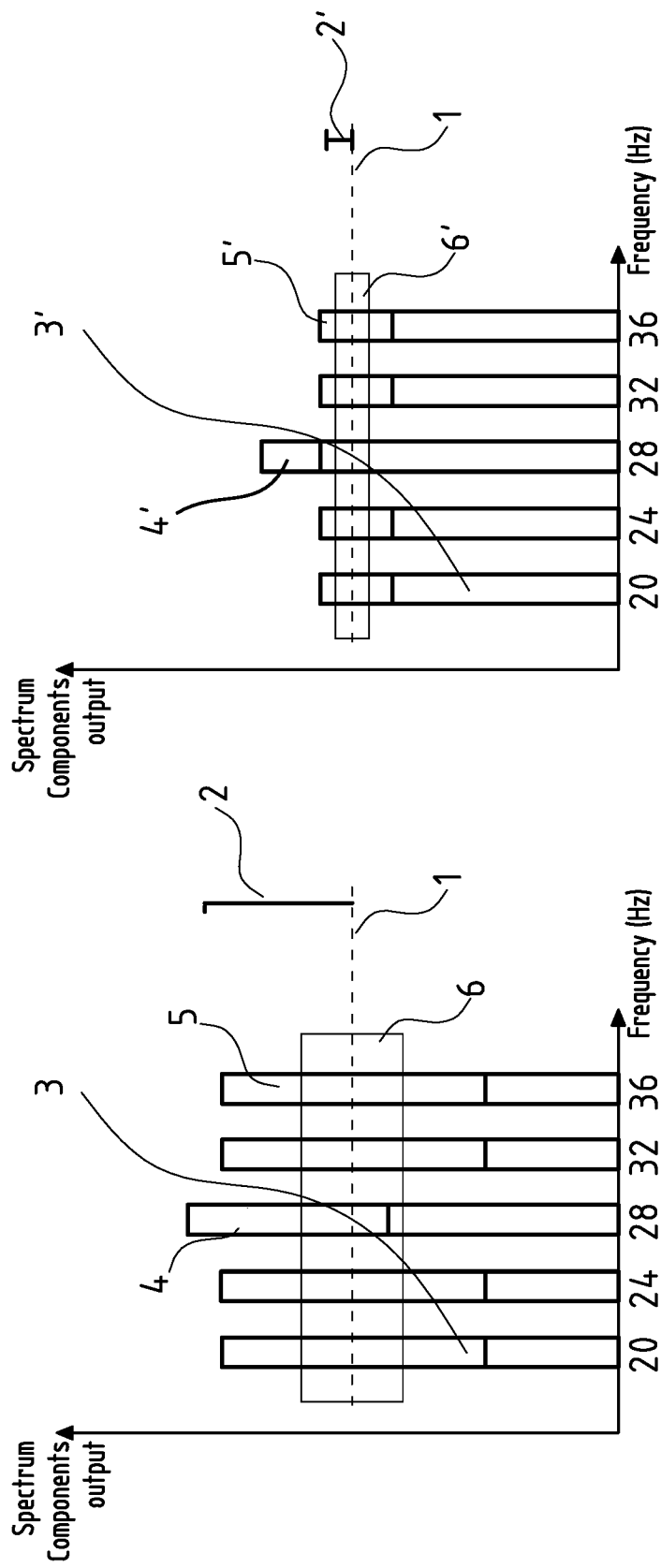
FIG. 1B is a graph showing a spectrum comprising a vortex component at 28 Hz and showing a frequency spectrum being obtained after averaging over sixteen runs.

Referring to the drawings, FIG. 1A and FIG. 1B illustrate how the noise reduction system according to the present invention works on the basis of a frequency spectrum comprising a vortex component at 28 Hz.

Prior to explaining FIG. 1A and FIG. 1B, however, the following basic explanations concerning measurements of flow, relative pressure, and temperature are given below.

The temperature measurement has its own TCR (Temperature Coefficient of Resistance) component with respect to the MEMS. The flow measurement and the measurement of the relative pressure share the same Wheatstone bridge located at the pressure sensitive membrane of the MEMS. The Wheatstone bridge outputs the differential pressure applied across the MEMS. This pressure consists of an alternating signal (AC) to be used for the flow sensor application, and a steady state signal (DC) for the measurement of pressure, or a slow changing DC signal for the measurement of relative pressure.

For the flow algorithm the AC signal is used but the DC signal, however, is not suited. Thus, a digital high pass filter provides a separate signal channel for the flow algorithm with only the AC signal and the DC signal being removed.

The pressure algorithm uses the DC signal, but here, the AC signal is not suited. Thus, a digital low pass filter provides a separate signal channel for the pressure algorithm with only the DC signal and the AC signal being removed.

Then, the relative pressure measured has to be compensated for dynamic pressure, because the diameter of the pipe through which the flow to be measured occurs has another diameter at location at which the MEMS is arranged.

Further, the basis measurement with respect to flow algorithm is a measurement of the frequency of the vortex generated sine. The method, which is chosen in the embodiment described here, is based on a calculation of the frequency spectrum of the AC signal. This is a discrete spectrum comprising, e.g., 100 components spaced apart from each other by 4 Hz. On this basis, since each frequency will "see" 4 Hz to both sides, any frequency of a sine will be detected by one or two frequency components. If the vortex consists, for example, of one pure sine of e.g., 80 Hz and having an amplitude of 100 (e.g., 100 AD count of e.g., 1 mV, an amplitude of 100 mV), then the frequency components of 80 Hz in the spectrum will output the amplitude of 100, and all other components will provide an output of zero. If, e.g., noise of 30 Hz and an amplitude of 12 is also present, then the frequency component for 12 Hz will provide the output of the value 12 as well.

Usually, a typical frequency spectrum will output a value above zero for the noise floor for all frequency components, even when the flow is zero. This effect results from electrical and hydraulic noise. When flow is applied to the flow meter, then a frequency component for the vortex sine will be output having a value above the value the noise floor has. Further, also some noise components may be present with a value higher than the value of the noise floor. Thus, the task of the flow algorithm in the sense of software is to analyze the frequency spectrum in order to be able to distinguish between the vortex sine component and the noise components. Since the vortex sine frequency flow characteristic is known, the latter is able to effectively detect and reject most of the noise components.

The nature of noise within the frequency spectrum can be de-scribed as outlined below. If there is no flow, then the output of all frequency components will be a random value higher or less than a mean value. The means value represents the noise floor and the random behavior is almost a normally distributed function. Then, the random behavior can be described by a single parameter, namely, the standard spread or just the sigma, 68% of the random output lies within one sigma and 99,7% lies within 3 sigma.

The noise amount and characteristic varies from application to application at the customer side, and so do noise floor and sigma. However, the sigma is represented by a certain known function of the noise floor so that when measuring the noise floor, then sigma may be calculated. Since the noise floor is measured, then, the actual noise floor and the actual sigma of the noise are also known for each application.

If the application involves high hydraulic noise, then this noise will "eat" the lower frequency components. In this case, the minimum flow cannot be measured and the system avoids detecting noise as flow.

Now, the basics for finding and approving the peak for the vortex will be described. First, the flow is analyzed with respect to the frequency spectrum so as to find the highest peak respectively meeting absolute peak criteria and relative peak criteria. The absolute peak criteria serve for verifying that the found peak is not a random noise signal but rather matches the characteristics of a vortex signal. The relative peak, which verifies that the found signal is not a random sign is determined by determining the difference between the maximum peak which has been found and the noise floor, whereby it has to have a minimum value, which is adopted to the actual sigma. The noise floor is calculated as the average of the peaks surrounding spectrum components. The frequency component being tested and its two neighbors are not included in the noise floor measurement, since the noise floor then would be higher than the correct value for a vortex component being tested.

The following description is given for explaining how to distinguish between the flow and noise. The basic principle for distinguishing between components comprising noise and the components needed for the evaluation ("good" components) starts at a condition of zero flow at which only noise being present, and at which the sigma is highest. The frequency spectrum component responds to noise with the noise floor (mean value) and the dispersion, sigma, which is calculated as described above. The flow algorithm, therefore, will always include both, noise floor and sigma. First, the flow algorithm is based on a zero flow hypothesis test. If the component output lies within the noise sigma (e.g., 3 sigma), this means that the relative peak criteria is not met, but the zero flow hypothesis is met with the flow being zero. Otherwise, if the absolute and relative peak criteria are met, then the frequency component output refers to flow.

The basic concept of the zero flow hypothesis in summary is as follows: The noise floor is measured, the sigma of the noise is calculated, and the relative peak is calculated by input of a confidence level and sigma. The zero flow hypothesis is selected with a confidence level (e.g. 3 sigma), thereby making it unlikely that noise is able to trigger an output above the relative peak criteria when flow is zero. If an output exceeds the relative peak criteria, it is likely that flow is present. In this case, flow will be detected, if the absolute peak criteria also are met.

The appropriate level of the relative peak criteria is the sigma being multiplied by a factor providing the desired confidence (e.g. a factor 3 will provide 3 sigma as confidence level). This is configurable. However, if the confidence level is set to be higher, then the relative peak criteria will increase. Thus, if sigma increases, the relative peak criteria increase too. The relative peak criteria respond to the actual noise in the application so that the hypothesis test parameters actually adopt to the actual noise in the application. This provides for a reliable and effective procedure to distinguish between "too noise components" and "good components" in an unpredictable application.

Now, the basics of the noise reduction system will be described. The noise is reduced by averaging the frequency components over several runs N. When averaging, the sigma $\sigma$ of the average result is reduced to the value $\sigma/\sqrt{N}$. When averaging, for example, over a series of four measurements, the sigma of the result is reduced to half, whereas averaging over a series of sixteen measurements reduces sigma to ¼. Both components and the noise floor are averaged.

FIG. 1A shows a spectrum for only one run and vortex component at 28 Hz, whereas FIG. 1B shows a spectrum for an average of sixteen runs and a vortex component at 28 Hz. After separating the 28 Hz vortex component from the noise, the relative peak value, which in FIG. 1B is also reduced to ¼ compared to FIG. 1A, now allows the 28 Hz vortex component to always be selected. By repeating the calculation of the frequency components and averaging the latter, the sigma of the dispersion is reduced. This, however, only is necessary in the low flow range, as already explained above. Channels of an average of 2, 4, 8, and 16 are available, whereby the last channel has ¼ sigma of the channel without averaging.

The relative peak criteria are calculated for each channel including the sigma and noise floor measurement as well as the sigma of each channel. The sigma of the noise floor is rather low since it is measured by six different components reducing the sigma to 0.4 * sigma. Each channel has its own noise floor due to different averaging.

With respect to FIG. 1A, the frequency spectrum is shown without an averaging procedure for a vortex of 28 Hz. The upper light grey colored portion of each column represents the respective portion of noise, which in the example of FIG. 1A is rather large. Thus, regarding the highest peak at a frequency of 28 Hz, it cannot be determined with certainty whether this corresponds to the vortex. The relative peak criteria is only suitable for distinguishing between the 28 Hz vortex component and the surrounding noise components so as to avoid a misinterpretation of a noise peak for the vortex peak. However, here, the 28 Hz peak has a low probability to be selected, thus, the flow algorithm, without the average channel system and without the adaptive relative peak criteria, will indicate zero flow most of the time and will only be able to determine the correct 28 Hz vortex component for about ⅕ of times according to standard probability.

In contrast, in FIG. 1B the frequency components are averaged sixteen times, thereby improving the detection of the vortex componenet in the spectrum. In this example, the vortex component will be determined correctly from the spectrum with a 100% probability.

The selection of the average channel is tested from the "no-average channel", followed by the "average-of-2-channel", and so on up to the last "average-of-16-channel". Then, the first channel detecting flow is selected. If no channel at all detects flow, then the flow is determined to be zero.

The above described procedure is very reliable due to the averaging, and thus, there is no risk to select a noise component wrongly instead of the desired vortex component from the spectrum.

The noise reduction system, thereby, is adaptive both to noise of each application and to the appropriate amount of averaging.

Figure 2A:
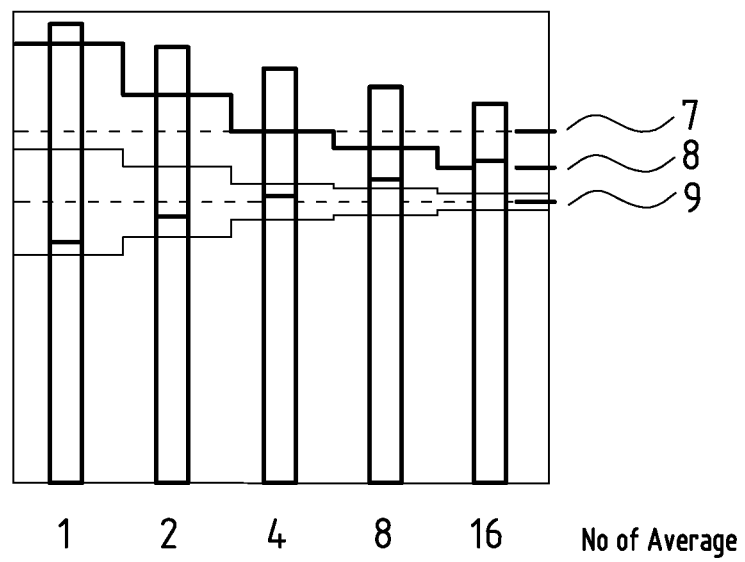
FIG. 2A is a graph showing the development of respective components from the frequency spectrum after different numbers of averaging procedures and showing a vortex frequency component.
Figure 2B:
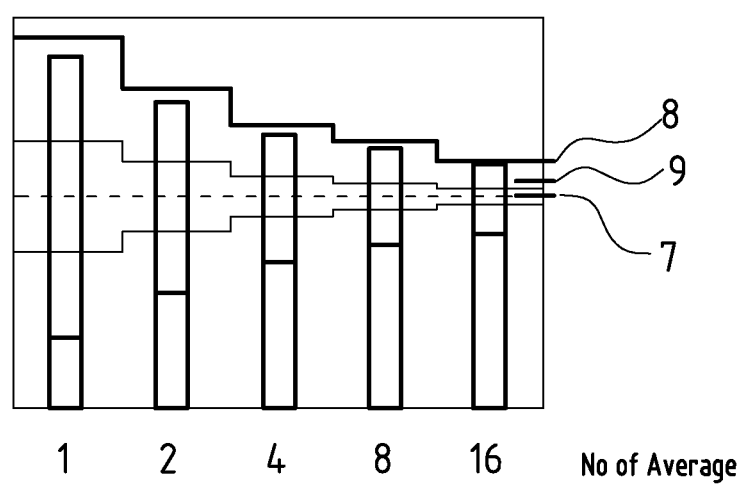
FIG. 2B is a graph showing the development of respective components from the frequency spectrum develop after different numbers of averaging procedures and showing a noise frequency component.

FIG. 2A shows how a vortex frequency component develops according to the number of averaging procedures, and FIG. 2B shows how a noise frequency component develops over the number of averaging procedures.

It should be noted that the sine signal amplitude, generated by the vortices, increase by a magnitude of two with flow. As noise usually will be rather constant in magnitude, the ratio of signal to noise (S/N) is very low, thus resulting in a noise signal with low flow. However, it will quickly increase with flow, and the sine curve will be free from critical noise rather fast. Therefore, the problem with respect to noise focusses to the lowest area of the flow range.

In FIG. 2A, as an example, the 28 Hz component shown in FIG. 1B is used, whereby the 28 Hz component, the relative peak criteria, and the noise floor spread or dispersion are shown as a function of the number of averaging procedures, starting from 1 to 16 runs. Here, the average of 16 is the only one which enables a correct determination of the vortex component. It should be noted that the knowledge that a vortex component will always have lower noise dispersion than a noise component contributes to the reliability of the hypothesis test.

FIG. 2B shows the spectrum at zero flow. Also here, the noise frequency component, the relative peak criteria and the noise floor spread or dispersion are shown as a function of the number of averaging procedures. The range of noise with the desired confidence level is below the relative peak criteria at all averaging levels so as to provide the same confidence for zero flow output for every averaging level.

Figures 3, 4, 5:
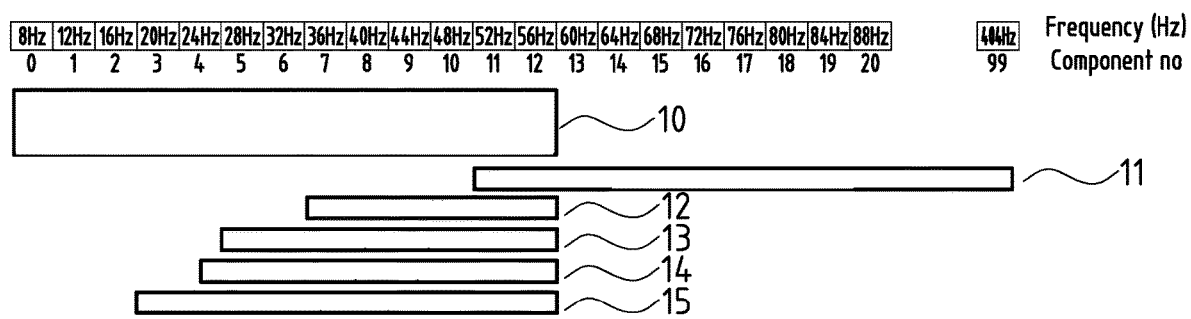
FIG. 3 is a table for the basic selection of average channels.
FIG. 4 is a high resolution frequency spectrum which illustrates an example for limiting the frequency area of average channels.
FIG. 5 is a table according to which steady state flow and dynamic flow are distinguished from a pattern of two valid peaks by using all average channels.

FIG. 3 shows a table for the basic selection of average channels. In the table, a value of "0" means no valid peak in the average channel. In contrast, in the table, a value of "1" indicates a valid peak in the average channel. A value of "X" means, that the latter should not be considered. A valid peak can be defined as output which meets the absolute peak criteria and the relative peak criteria as well. The selected average channel here is indicated by the grey color. This basic selection prioritizes the lowest average channels. However, a more advantageous selection will be described below.

The vortex frequency is calculated as an interpolated value of several frequency components within the spectrum. This provides an accurate result at any vortex frequency. This interpolating accuracy will even increase with increasing averaging runs, when flow is in steady state, since the components comprise less noise and will have lower tolerance. Thus, preferably, the channels with high averaging should be used, if possible a higher resolution is needed at low flow and thus a relatively high noise floor. However, the channels with low averaging should be used to keep response time at a minimum. A preferred compromise is here to select the averaging procedure with the least number of averaging runs required to identify a signal in the noise with the desired confidence level.

The minimum noise sets a minimum limit for the frequency for each average channel. This minimum noise will not be able to provide the lowest frequency component in the spectrum being valid for each measurement. Thus, this channel is not allowed to measure the lowest flow area. The "average-of-two-channel" is able to reliably determine lower frequencies than the "no-average-channel" and therefore represents the lower limit. The same applies for all other average channels. The "average-of-sixteen-channel" starts at the lowest frequency.

FIG. 4 shows a high resolution frequency spectrum which illustrates an example for limiting the frequency area of average channels. Here, the lowest frequency in the spectrum is component 3 at 20 Hz, whereas components 0, 1, and 2 at 8 Hz, 12 Hz, and 16 Hz, respectively, are below the frequency range of the vortex frequency range. The individual limit of the frequency range for the average channels provides for better interpolation of frequency accuracy and better suppression of sporadic noise.

Even better results and accuracy as well as an even better suppression of sporadic noise can be achieved by limiting the step from one average channel to the next one, and especially the step over more than one channel. This is of particular relevance with respect to steady state flow, and in those cases, where an "average-of-16-channel" has to be used. In this case, sporadic valid peaks of the low average channels can be avoided to be selected. This procedure is implemented in the so-called intelligent average channel selection described below and illustrated in FIG. 5.

FIG. 5 shows a table according to which "steady state flow" and "dynamic flow" may be distinguished from a pattern of two valid peaks by using all average channels, thereby providing an intelligent average channel selection procedure according to the respective state. Namely, at steady state flow, the "average-of-16-channel" will show valid peaks, but no dynamic flow. The table of FIG. 5 shows the patterns to be detected. A table value of "0" indicates that no valid peak is present for any component in the respective average channels. A table value of "1" indicates that a valid peak is present for at least one component in the respective average channels, whereas the value "X" indicates that this should not be taken into consideration. A valid peak is defined as output which meets the absolute peak criteria and the relative peak criteria. The cells of the table which are shaded in grey indicate the selected average channels.

At steady state flow, the "average-of-16-channel" is selected to suppress sporadic noise and high accuracy. However, if at least three lower average channels above also have valid peaks, then the "average-of-8-channel" is selected to enable faster response.

At dynamic flow, the "average-of-2-channel" is selected in order to suppress sporadic noise and still provide fast response time. If, however, a pattern which is not included in the table shown in FIG. 5 is present, then the selection of default average channels as illustrated in the table shown in FIG. 3 is to be applied. However, the above procedure described above with respect to FIG. 5 compared to the procedure described with respect to FIG. 3 has the advantage that by always selecting a larger averaging here in contrast to always select the smallest averaging (FIG. 3), an output having less dispersion/spread is obtained. Accordingly, the result is more resistant against large and sporadic noise pulses that may "cheat/trick" the lowest averaged channels. However, this advantage comes at the cost of a slower response time needed for larger averaging.

Thus, the above described procedure provides an intelligent noise reduction means integrated into the sensor algorithm for measuring, managing, and reducing noise when carrying out a measurement with a measuring device having more than one senor. As already mentioned above, the method according to the present invention is suitable for measurement devices as vortex measurement devices or thermal flow meters. However, also other measurement devices having a plurality of sensors are can be employed.

While specific embodiments of the invention have been shown and described in detail to illustrate the application of the principles of the invention, it will be understood that the invention may be embodied otherwise without departing from such principles.

What is claimed is:

1. A method for determining a flow of a fluid, the method comprising:
    positioning a vortex measuring device in the fluid;
    measuring under predetermined measuring device operating conditions an output from the vortex measuring device;
    deriving at least one time-dependent signal from the output, the time-dependent signal comprising a portion being representative of the flow, and a portion being representative of noise;

determining, based on a frequency spectrum of the signal, a value representative of the noise floor;

identifying, based on the frequency spectrum of the signal, a peak component;

determining a relative peak criterion based on the determined value representative of the noise floor; and if the peak component satisfies the relative peak criterion, determining the flow of the fluid by applying a predetermined algorithm to the frequency spectrum.

2. The method according to claim 1, wherein the value representative of the noise floor is calculated as an average of a number of selected noise representative frequencies spectrum components.

3. The method according to claim 2, wherein the noise representative frequencies spectrum components are selected among frequency components below a predefined frequency value, wherein the noise representative frequencies spectrum components are the remaining components after selecting a predetermined number of high value frequency components, wherein the high value frequency components are a predetermined number of frequency components with the highest amplitude values.

4. The method according to claim 1, wherein a relative peak signal is determined from a difference between the noise floor and the wanted signal, wherein the relative peak signal is larger than or equal to the relative peak criterion.

5. The method according to claim 1, wherein the predetermined algorithm is adaptive with respect to the noise by:
always calculating the relative peak criterion as a function of the noise being present, and
selecting a suitable averaging procedure securing a stable wanted signal output.

6. The method according to claim 1, wherein the frequency spectrum is calculated by averaging frequency spectra of a predetermined number of time dependent signals derived from the output of the measuring device.

7. The method according to claim 1, wherein the measuring device is a vortex measuring device, and wherein the time-dependent signal comprises a portion being representative of a flow, and a portion being representative of noise.

8. The method according to claim 1, wherein the measuring device is a thermal flow meter comprising a plurality of temperature sensors for measuring a thermal profile around a heated body.

9. A method for determining flow of a vortex measuring device, the method comprising the step of:
computing a sequence of frequency spectra, each frequency spectrum of the sequence being computed by the method comprising averaging frequency spectra of a predetermined number of time dependent signals derived from the output of the measuring device, wherein for the first spectrum of the sequence, the predetermined number is 1, and for each subsequent spectrum of the sequence, the predetermined number is increased by a predetermined positive integer value, and wherein for each frequency spectrum of the sequence of frequency spectra, the corresponding flow is determined by applying the predetermined algorithm; and
evaluating if at least one flow is determined to be greater than the noise floor, then the first spectrum of the sequence of spectra where the determined flow is greater than the noise floor, is selected as basis for calculating the flow of the vortex measuring device, otherwise determining the flow to be zero flow.

10. The method of claim 9, wherein each frequency spectrum is divided into a number of discrete frequency components, and identifying the peak component comprises the step of deriving the peak by interpolating based on several frequency components.

11. The method of claim 9, wherein:
each frequency spectrum of the sequence of frequency spectra is numbered with a consecutively increasing channel number, the first frequency spectrum being numbered with the smallest channel number, the last frequency spectrum being numbered with the largest channel number, wherein frequency spectra having higher channel numbers being averaged over frequency spectra of predetermined numbers of time dependent signals with lower frequency limits than frequency spectra of predetermined numbers of time dependent signals, having lower channel numbers;
prior to the step of evaluating if at least one flow is determined to be greater than the noise floor, for each frequency spectrum of the sequence of frequency spectra, the corresponding flow is determined by applying the predetermined algorithm, and
if the flow of the spectrum having the smallest channel number is determined to be greater than the noise floor, that spectrum is selected as basis for calculating a steady state flow of the vortex measuring device, otherwise if the flow of the spectrum having the smallest channel number is determined to be equal to the noise floor and at least one of the spectra having a channel number between the smallest and the largest channel number having a flow greater than the noise floor, one of the spectra having a flow greater than the noise floor is selected as a basis for calculating a dynamic flow of the vortex measuring device, otherwise the noise representative frequencies spectrum components are selected among frequency components below a predefined frequency value, wherein the noise representative frequencies spectrum components are the remaining components after selecting a predetermined number of high value frequency components, wherein the high value frequency components are a predetermined number of frequency components with the highest amplitude values.

12. The method according to claim 9, further comprising a step of determining a stationary flow and a dynamic flow.

13. The method according to claim 9, wherein the output signal is a relative pressure signal.

14. The method according to claim 9, wherein the vortex measuring device comprises a vortex sensor which is arranged within a one-port housing.

15. A vortex sensor comprising:
a sensor configuration providing an output for deriving at least one time-dependent signal, the at least one time dependent signal being derived from the output under predetermined measuring device operating conditions;
evaluating means for evaluating a frequency spectrum representative of the at least one time-dependent signal, the time-dependent signal comprising a portion being representative of a wanted flow signal, and a portion being representative of noise, wherein the evaluating comprises the steps of:
determining, based on the frequency spectrum of the signal, a value representative of the noise floor;
identifying, based on the frequency spectrum of the signal derived under the predetermined operating condition, a peak component;
determining a relative peak criterion based on the value representative of the noise floor; and if the peak component satisfies the relative peak criterion, determining the wanted flow signal by applying a predetermined algorithm.

16. A vortex sensor according to claim 15, wherein the evaluating means is configured to compute a sequence of frequency spectra, each frequency spectrum of the sequence being computed by the method comprising averaging frequency spectra of a predetermined number of time dependent signals derived from the output of the measuring device, wherein for the first spectrum of the sequence, the predetermined number is 1, and for each subsequent spectrum of the sequence, the predetermined number is increased by a predetermined positive integer value, and wherein for each frequency spectrum of the sequence of frequency spectra, the corresponding flow is determined by applying the predetermined algorithm and being configured to evaluate if at least one flow is determined to be greater than the noise floor, then the first spectrum of the sequence of spectra where the determined flow is greater than the noise floor, is selected as basis for calculating the flow of the vortex measuring device, otherwise to determine the flow to be zero flow.

17. A vortex sensor according to claim 15, wherein the value representative of the noise floor is calculated as an average of a number of selected noise representative frequencies spectrum components and the noise representative frequencies spectrum components are selected among frequency components below a predefined frequency value, wherein the noise representative frequencies spectrum components are the remaining components after selecting a predetermined number of high value frequency components, wherein the high value frequency components are a predetermined number of frequency components with the highest amplitude values.

18. A vortex sensor according to claim 15, wherein a relative peak signal is determined from a difference between the noise floor and the wanted signal, wherein the relative peak signal is larger than or equal to the relative peak criterion.

19. A vortex sensor according to claim 15, wherein the predetermined algorithm is adaptive with respect to the noise by:
 always calculating the relative peak criterion as a function of the noise being present, and
 selecting a suitable averaging procedure securing a stable wanted signal output.

20. A vortex sensor according to claim 15, wherein the frequency spectrum is calculated by averaging frequency spectra of a predetermined number of time dependent signals derived from the output of the measuring device.

* * * * *